(12) United States Patent
Gudel et al.

(10) Patent No.: US 9,423,469 B2
(45) Date of Patent: Aug. 23, 2016

(54) TOROIDAL FLUXGATE CURRENT TRANSDUCER

(75) Inventors: Claude Gudel, Archamps (FR); Benjamin Marcoz, Beaumont (FR); Bernard Richard, Grens (CH); Gérard Gery, Allinges (FR)

(73) Assignee: LEM Intellectual Property SA, Fribourg (CH)

( * ) Notice: Subject to any disclaimer, the term of this patent is extended or adjusted under 35 U.S.C. 154(b) by 506 days.

(21) Appl. No.: 13/818,259

(22) PCT Filed: Aug. 19, 2011

(86) PCT No.: PCT/IB2011/053655
§ 371 (c)(1),
(2), (4) Date: Feb. 21, 2013

(87) PCT Pub. No.: WO2012/025859
PCT Pub. Date: Mar. 1, 2012

(65) Prior Publication Data
US 2013/0154629 A1    Jun. 20, 2013

(30) Foreign Application Priority Data

Aug. 24, 2010  (EP) .................................... 10173923

(51) Int. Cl.
*G01R 33/00* (2006.01)
*G01R 15/18* (2006.01)
*G01R 33/04* (2006.01)
*H01F 27/28* (2006.01)
(Continued)

(52) U.S. Cl.
CPC .......... *G01R 33/0017* (2013.01); *G01R 15/185* (2013.01); *G01R 33/04* (2013.01); *H01F 27/2895* (2013.01); *H01F 38/30* (2013.01); *G01R 1/04* (2013.01)

(58) Field of Classification Search
None
See application file for complete search history.

(56) References Cited

U.S. PATENT DOCUMENTS

| 5,066,904 A | 11/1991 | Bullock |
| 6,771,066 B2 | 8/2004 | Rippingale |

(Continued)

FOREIGN PATENT DOCUMENTS

| EP | 0356171 A2 | 2/1990 |
| EP | 0838686 A2 | 4/1998 |

(Continued)

OTHER PUBLICATIONS

International Search Report and Written Opinion issued by the European Patent Office, dated Nov. 8, 2011, for related International Application No. PCT/IB2011/053655; 17 pages.

(Continued)

*Primary Examiner* — Jermele M Hollington
(74) *Attorney, Agent, or Firm* — Faegre Baker Daniels LLP

(57) ABSTRACT

Toroidal fluxgate current transducer comprising a ring shaped fluxgate sensing unit (6) comprising a ring-shaped support (40), a saturable magnetic core (38) mounted on the support (40), an excitation coil (44) wound around the support and saturable core and a magnetic shell (32) mounted around the excitation coil, ring-shaped support and saturable core. The support is ringed-shape and comprises terminals (50,48) fixed to the support, a first pair of said terminals connected to ends of the excitation coil, and a second pair of said terminals connected to ends of a secondary coil of the current transducer.

22 Claims, 8 Drawing Sheets

(51) Int. Cl.
*H01F 38/30* (2006.01)
*G01R 1/04* (2006.01)

(56) References Cited

U.S. PATENT DOCUMENTS

| | | | | |
|---|---|---|---|---|
| 8,669,763 B2* | 3/2014 | Takatsuji | ............... | G01R 33/04 324/225 |
| 9,217,763 B2* | 12/2015 | Teppan | ................ | G01R 15/185 |
| 2004/0027120 A1* | 2/2004 | Rippingale | .......... | G01R 33/045 324/253 |
| 2006/0226826 A1* | 10/2006 | Teppan | ................. | G01R 33/04 324/117 H |
| 2011/0241665 A1* | 10/2011 | Takatsuji | ........... | G01R 33/0023 324/553 |
| 2012/0139527 A1* | 6/2012 | Teppan | ................. | G01R 19/20 324/127 |
| 2015/0293153 A1* | 10/2015 | Boettcher | .......... | G01R 19/0092 324/117 R |

FOREIGN PATENT DOCUMENTS

| | | |
|---|---|---|
| EP | 1450176 A1 | 8/2004 |
| EP | 2083277 A1 | 7/2009 |
| JP | 2011-17618 A1 * | 1/2011 |

OTHER PUBLICATIONS

Janosek, M. et al., "PCB sensor in fluxgate magnetometer with controlled excitation", Sensors and Actuators A, Elsevier Sequoia S.A., Lausanne, CH, vol. 151, No. 2, Apr. 29, 2009, pp. 141-144, XP026053125, ISSN: 0924-4247, DOI: 10.1016/J.SNA.2009.02. 002.

* cited by examiner

TOROIDAL FLUXGATE CURRENT TRANSDUCER

The present invention relates to a toroidal fluxgate current transducer with a secondary coil for closed-loop applications.

Fluxgate transducers have a saturable magnetic core surrounded by an excitation coil that applies an alternating magnetic field that alternatingly saturates the magnetic core. In the presence of an external magnetic field, a bias is applied on the saturation of the saturable core that affects the symmetry of the excitation signal. This asymmetry is correlated to the amplitude of the external magnetic field and can thus be used to read the amplitude of the external magnetic field. In magnetometers, the excitation current is processed by an electronic circuit that generates a feedback signal to a secondary coil (also called a compensation coil) wound around the fluxgate transducer, or to a magnetic circuit coupled to the fluxgate transducer. The compensation current seeks to cancel the effect of the external magnetic field, whereby the secondary (or compensation) current thus represents the magnitude of the magnetic field. In current transducers, the magnetic field is generated by a primary current (the current to be measured) flowing in a primary conductor. The primary conductor is typically positioned passing through a magnetic circuit formed by or coupled to the magnetic field transducer.

Certain known fluxgate transducers have an annular shape that surrounds a central aperture through which the primary conductor passes. Fluxgate transducers have a high sensitivity and are thus well adapted to measure small currents, or small amplitude differential currents, however they are relatively costly to manufacture and implement in comparison to open-loop current transducers or closed-loop current transducers based on Hall effect magnetic field detectors. Factors influencing the cost of current transducers based on the fluxgate principle, are the provision of the excitation coil and the secondary coil, the provision of the saturable core and the interconnection of the coils to an electronic circuit.

The sensitivity of fluxgate transducers also leads to more stringent manufacturing tolerances required for the coils and the relative position of various components, that also lead to increased manufacturing costs.

An object of this invention is to provide a closed-loop current transducer based on a toroidal fluxgate magnetic field detector that is accurate, reliable and economical to manufacture.

It would be advantageous to provide a closed-loop toroidal fluxgate current transducer that is economical to manufacture in large series.

It would be advantageous to provide a closed-loop toroidal fluxgate current transducer that is compact.

It would be advantageous to provide a closed-loop toroidal fluxgate current transducer that is robust.

Objects of this invention have been achieved by providing the closed-loop toroidal fluxgate current transducer according to claim 1.

Disclosed herein is a toroidal fluxgate current transducer comprising a ring shaped fluxgate sensing unit comprising a dielectric or insulating support, a saturable magnetic core mounted on the support, an excitation coil wound around the support and saturable core and a magnetic shell mounted around the excitation coil. The support is ring-shaped and comprises terminals fixed to the support, a first pair of said terminals connected to ends of the excitation coil, and a second pair of said terminals connected to ends of a secondary coil of the current transducer. Advantageously, integration of the connection terminals for both the secondary and excitation coils in the support for the saturable core, simplifies manufacturing of the assembly and interconnection of the sensing unit to a signal processing circuit. This configuration also provides a more compact, reliable and robust arrangement.

The terms "toroidal" and "ring" used herein are not limited to circular shapes but encompass square, rectangular, polygonal, elliptical or any regular or irregular closed or almost closed shape surrounding an aperture to allow one or more primary conductors to pass therethrough.

The signal processing circuit may comprise a circuit board connected to the terminals of the sensing unit.

The sensing unit may further comprise dielectric housing shells mounted around the excitation coil and saturable core and forming a support around which the secondary core is wound. The dielectric shell may advantageously comprise a plurality of spaced apart inwardly radial fins that serve to laterally support the coil and to position the sensing unit in a housing of the transducer. The dielectric shell may advantageously comprise protuberances engaging in complementary orifices in a circuit board of the transducer to position the circuit board with respect to the sensing unit and the housing of the transducer.

The ring-shaped dielectric or insulating support for the saturable core and excitation coil may also comprise a plurality of spaced apart radial fins providing positioning surfaces configured to position the support with respect to magnetic shells mounted around the dielectric support and excitation conductor.

The transducer may advantageously comprise an annular inner magnetic shield and an annular outer magnetic shield, for example made of a strip or band of material with a high magnetic permeability folded in a ring shape. The inner magnetic shield serves to reduce the effect of off-centre primary conductor position through the central passage, whereas the outer magnetic shield serves to reduce interference from external magnetic fields.

Objects of this invention have been achieved by providing the closed-loop toroidal fluxgate current transducer according to claim 7.

In another aspect of the invention, the transducer comprises a primary conductor unit provided as a separate component, comprising a dielectric body and a plurality of conductors configured for carrying a current to be measured held together within the dielectric body forming a general U or V-shaped component separably mountable through the central passage of the housing and lockable to the housing. The dielectric body may be a plastic body moulded over the primary conductors and comprise integrally moulded elastic clip arms that interengage with complementary clips in the transducer housing to fix and lock the primary conducting unit to the transducer housing. The dielectric body may further comprise positioning shoulders or flanges that abut against the transducer housing to position the primary conductor unit with respect to the housing.

In an embodiment, the primary conductor unit may comprise at least four primary conductors forming at least first and second conductors pairs, a first pair for carrying current in one direction and a second pair for carrying current in the opposite direction, the conductor pairs arranged such that the conductors of one pair are positioned between and interleaving the conductors of the other pair. In this configuration, the transducer may operate as a differential transducer, to measure a difference in current between two conductors or conductor pairs with opposite current flows.

In an embodiment, the primary conductor unit may comprise at least four primary conductors used to carry three phase currents and a neutral of a three-phase system or a test current for the autotest capability of the system in which the transducer is used. In this configuration, the transducer may operate as a differential (or summing) current transducer that measures the sum of the currents in a three-phase system that should be close to zero during normal operation.

The primary conductors may be in the form of extruded conductor wires or stamped and formed from sheet metal, overmolded by the dielectric body or inserted in the dielectric body of the primary conductor unit. Alternatively, the primary conductors may be formed as conductive tracks deposited on a board (e.g. a printed circuit board).

Further objects and advantageous features of the invention will be apparent from the claims and the following detailed description of embodiments of the invention in relation to the annexed drawings in which:

FIG. 1b is a perspective exploded view of the embodiment of FIG. 1a;

FIG. 2d is a cross-sectional view of the embodiment of FIG. 2a;

FIG. 4b is an exploded view of the unit of FIG. 4a.

Figure 1A:
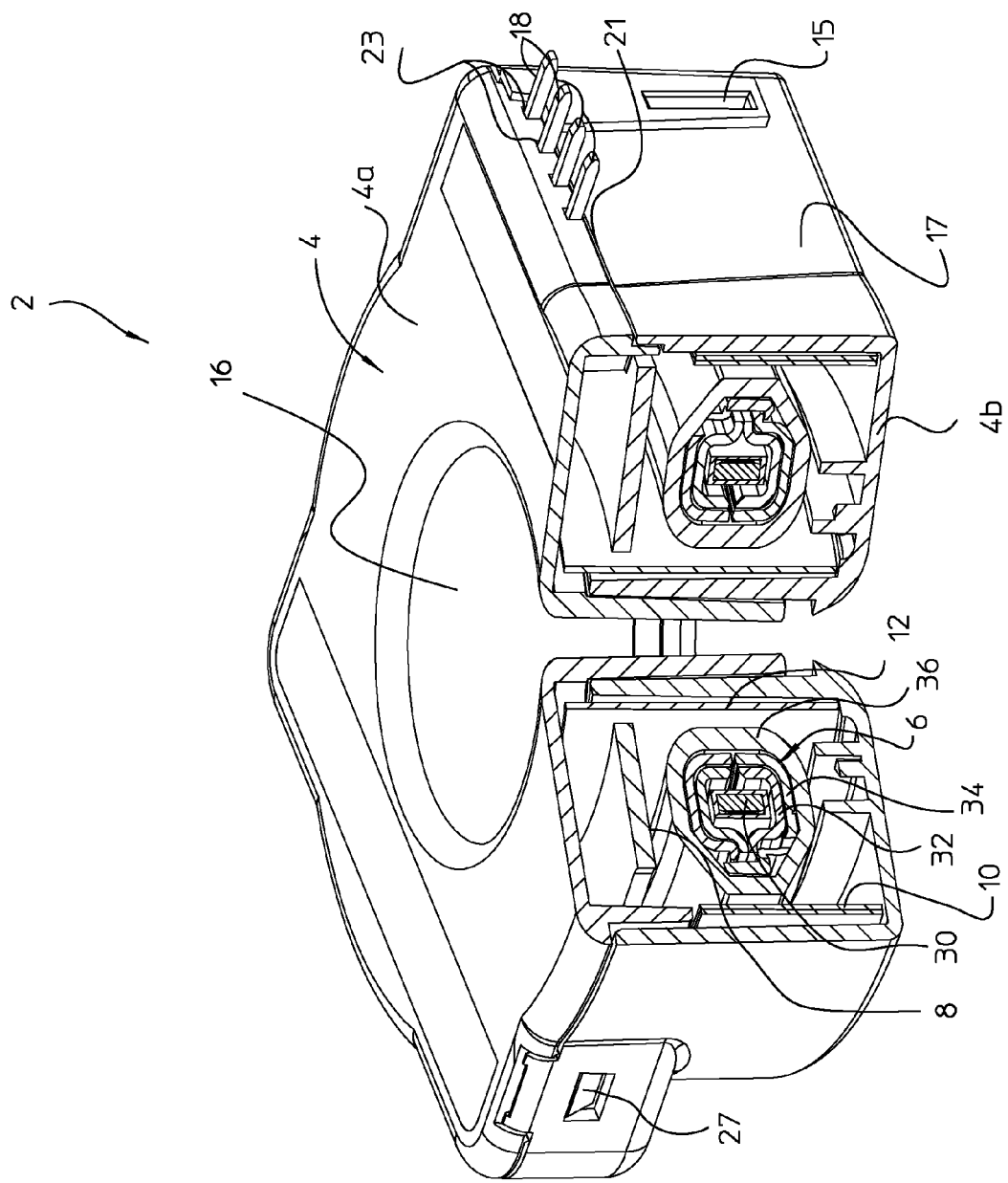
FIG. 1a is a perspective view with partial cross section of a toroidal fluxgate current transducer according to an embodiment of this invention.
Figure 1B:
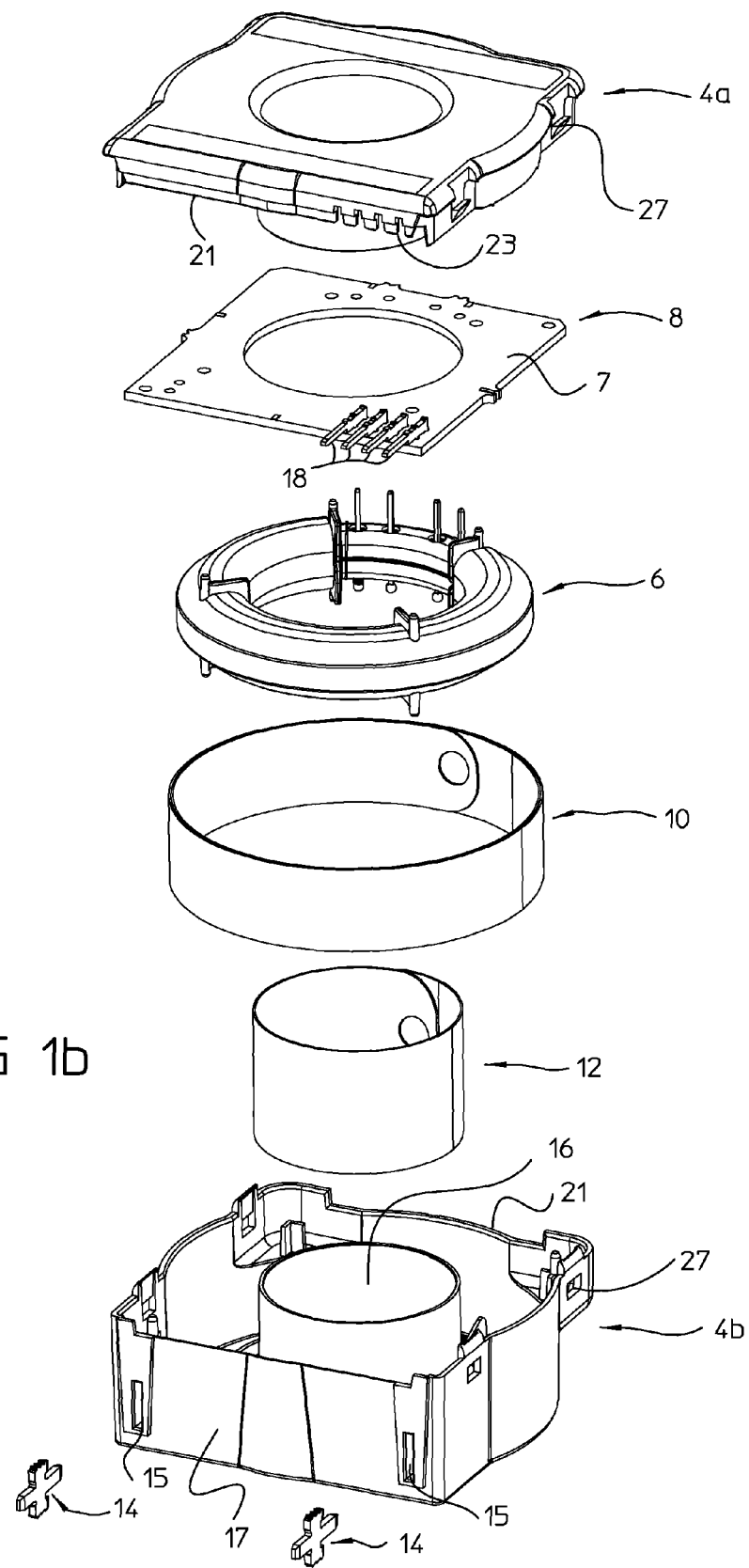
Figure 1C:
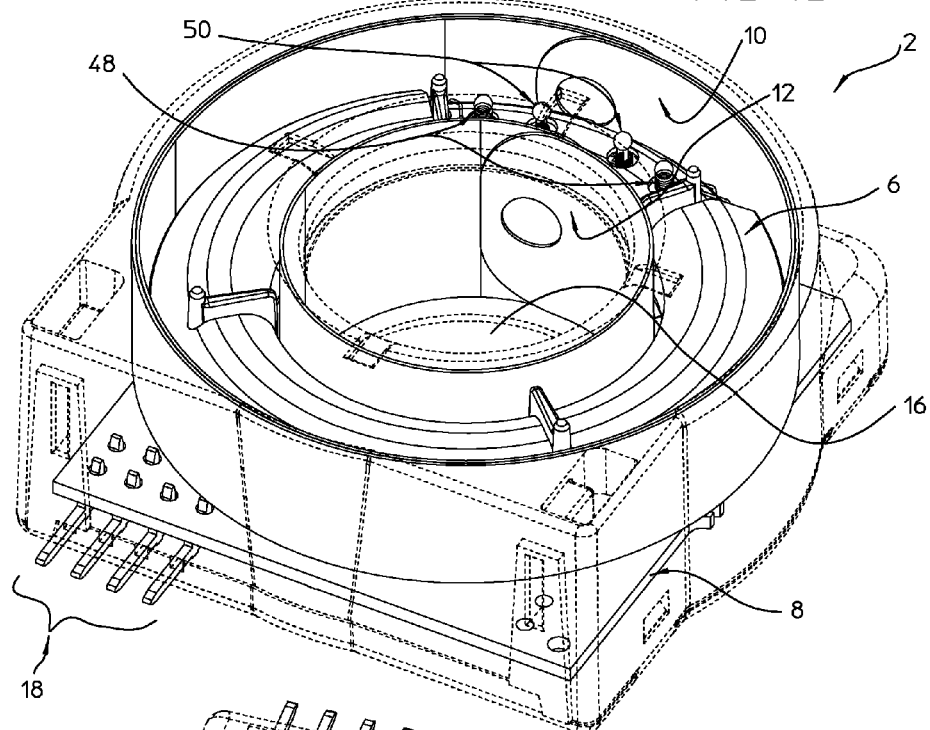
FIGS. 1c and 1d are perspective views of the embodiment according to FIG. 1a, with the housing made transparent in order to better view the components inside the housing.
Figure 1D:
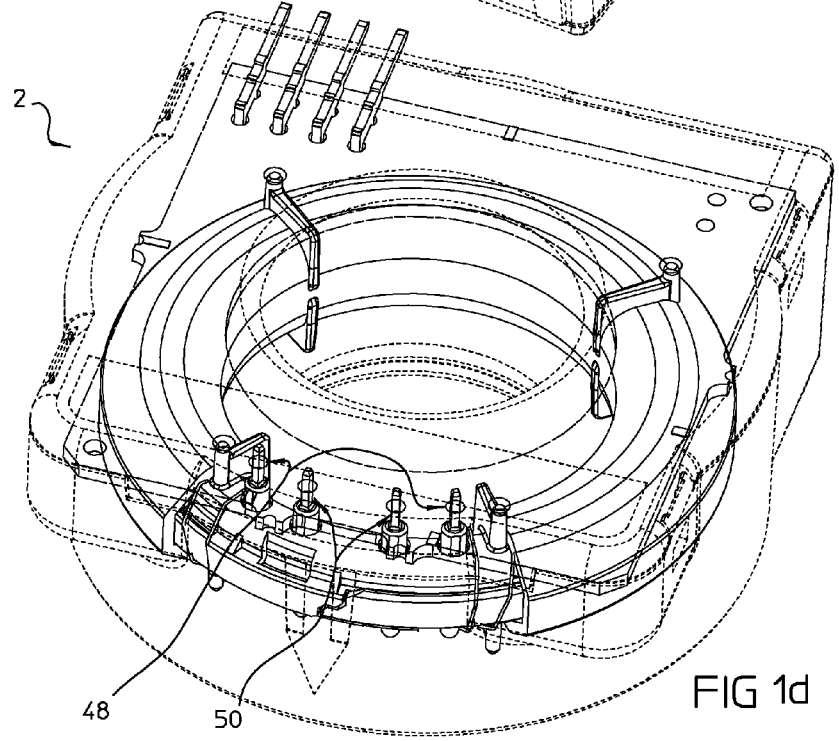

Referring to the figures, starting first with FIGS. 1a to 1d, a current transducer 2 according to an embodiment of this invention comprises a housing 4, a toroidal fluxgate sensing unit 6 mounted in the housing, a signal processing circuit 8, for example comprising a printed circuit board 7, also mounted in the housing and having electrical terminals 18 extending through the housing for connection to an external circuit for electrical supply and output of the measurement signal. The transducer may comprise a central passage 16 through which extend a conductor or a plurality of conductors 20, 20a, 20b carrying the current to be measured. The current to be measured shall be named the primary current and the conductors the primary conductors. The transducer further comprises an inner magnetic shield 12 and an outer magnetic shield 10 positioned respectively radially inside, and radially around the fluxgate sensing unit 6. The magnetic shields 10, 12 may advantageously be made of a folded strip or band of material with a high magnetic permeability such as silicon steel, permalloy, supermalloy, amorphous or nanocrystalline alloys an the like. The shields may also be made of a cylindrical section of extruded or cast material or have other non cylindrical shapes and formed by other processes, such as stamped and formed from sheet material. The outer shield 10 serves to reduce the influence of external magnetic fields, in particular magnetic fields that are generated outside of the central passage 16, such as disturbances from electrical conductors, electrical motors and other magnetic field generating equipment positioned around or in the proximity of the current transducer. The inner shield 12 serves to form a magnetic circuit that redistributes the magnetic field of a primary conductor extending through the central passage 16 in order to reduce the effect off-center primary conductors extending through the passage 16.

The toroidal fluxgate sensing unit 6 may have a closed circular shape as shown in the figures, or may have other closed or almost closed shapes such as square, rectangular, polygonal, elliptical or any regular or irregular shape surrounding an aperture to allow the one or more primary conductors to pass therethrough.

The transducer according to this invention may advantageously be employed for measuring a so-called differential current, which is the sum of the currents flowing in multiple primary conductors. This may be used for example to determine leakage in a circuit. For example, a pair of conductors of a closed electrical circuit passing through the central passage 16 would have currents of equal amplitude but opposite direction in a case of normal operation, the magnetic fields generated by the opposing currents cancelling each other out. If there is leakage in the circuit, the supply and return currents would not have an equal amplitude and the resulting difference generates a non null magnetic field that is correlated to the differential current. The inner radial shield 12 acts as a magnetic circuit that captures the magnetic dipole field generated the conductors and circulates the field within the magnetic shield thus reducing the off-center effects of each of the conductors on the magnetic field sensing unit 6.

The circuit board 8 is connected to an excitation coil of the sensing unit 6 and to a secondary (compensation) coil of the sensing unit and may further comprise components for filtering or pre-processing of the measurement signal. The circuit board interconnects the excitation coil and secondary coil to an external circuit via the connection terminals 18 that project through a mounting face 17 of the transducer. The connection terminals 18 comprise terminals for connection to a power supply and terminals for delivering the measurement signal. The mounting face 17 may be provided with mounting cavities 15 in which mounting pins 14 are force-fit inserted, the mounting pins of stamped and formed sheet metal adapted for soldering, welding or force-fit insertion through holes of an external circuit board to which the terminals 18 are also connected. The connection of both the terminals and the mounting pins 14 serve to mechanically secure the transducer to an external device.

Figure 2A:
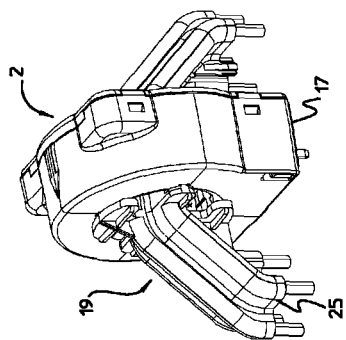
FIG. 2a is a perspective view of a fluxgate current transducer according to an embodiment of this invention, the transducer provided with a primary conductor preassembled to the transducer housing.
Figure 2C:
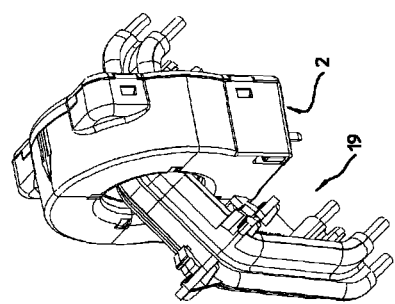
FIGS. 2b and 2c are perspective views of the embodiment of FIG. 2a showing the primary conductor member being assembled to the transducer housing.
Figure 2B:
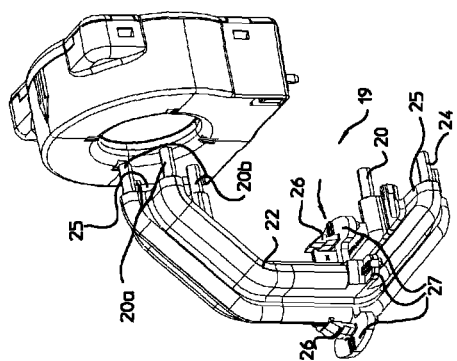
Figure 2D:
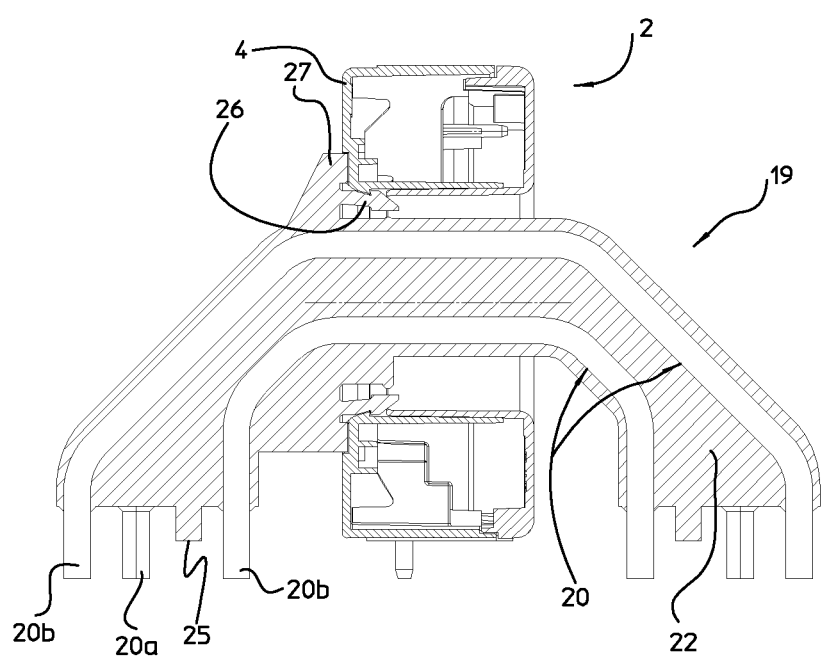

Referring now to FIGS. 1a to 1d, in conjunction with FIGS. 2a to 2c, a transducer according to a variant may be further comprise a primary conductor unit 19 comprising a plurality of conductors 20 held together within a dielectric body 22 that may be in a form of a plastic body moulded over the conductor wires 20 to form a general U or V-shape component mountable through the central passage 16 of the transducer housing 4. Connection ends 24 of the primary conductors 20 at both ends of the primary conductor unit 19 are parallel and project in the same direction. The connection ends 24 project beyond a mounting face 25 of the dielectric body, which is arranged in the same plane as the mounting face 17 of the transducer, or essentially the same level, so that the connection terminals 18, the mounting pins 14, and the primary conductor connection ends 24 may be simultaneously mounted on an external substantially planar circuit board.

The primary conductor unit 17 is advantageously provided as a separate component that is separately manufactured and may optionally be mounted to the transducer housing 4 depending on the use and application of the transducer. The essentially U-shaped or V-shaped primary conductor unit 19 is configured to be inserted through the central passage 16 of the transducer 2 starting from one end and feeding through the passage 16 until it is symmetrically positioned, with the connection ends 24 projecting beyond the mounting face 14. The dielectric body 22 may advantageously comprise integrally moulded elastic clip arms 26 that interengage with complementary clips found in the transducer housing 4 to fix and lock the primary conducting unit to the transducer housing. The dielectric body 22 may further comprise positioning shoulders or flanges 27 that abut against the transducer housing 4 to position the primary conductor unit with respect to the housing. The primary conductor unit 19 may advantageously comprise at least four conductors 20, the at least four conductors forming at least first and second conductors pairs, a first pair 20a for carrying the current in one direction and a second pair 20b for carrying the current in the opposite direction. The conductor pairs are arranged such that the conductors of one pair are positioned between and interleaving the conductors of the other pair. This arrangement improves the distribution of the magnetic field and particularly cancellation of the magnetic field by currents of equal amplitude but opposite in direction, leading to a better pickup of differential currents between one conductor pair and the other.

As shown in FIGS. 1a to 1d, the housing 4 may be made in two parts 4b, 4a, one of the parts 4a acting as a cover part that is clipped over the housing part 4b in which components comprising the sensing unit 6, the radial shields 10, 12 and finally the circuit board 8 have been assembled in an axial direction A into the main housing portion 4b. The circuit board 8 is mounted as one of the last components proximate the cover portion 4c such that the connection terminals 18 may be positioned passing through cavities 23 positioned at an interface 21 where the cover portion 4a meets the main housing portion 4b. The circuit board 8 may be pre-connected and pre-fixed to the sensing unit 6 before assembly in the housing. Alternatively, the connection and fixing together of the circuit board 8 to the sensing unit 6 may be performed when assembling the components in the main housing portion 4b. The cover 4a may be permanently fixed to the main housing portion 4b by means of clips 27 or by welding such as bonding, or both. The interior of the housing portion 4b may also be filled with a dielectric resin.

Figure 3:
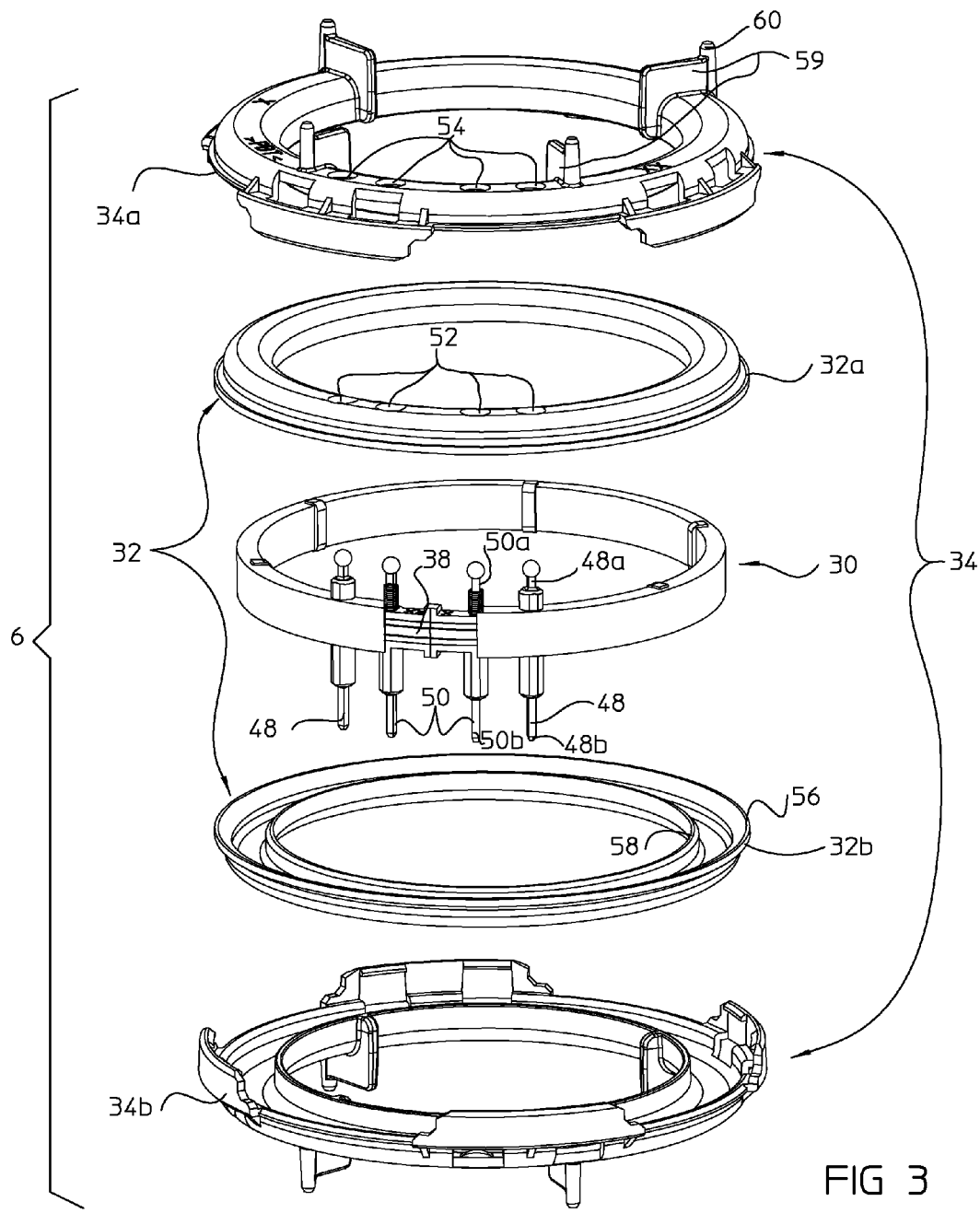
FIG. 3 is an exploded perspective view of a toroidal fluxgate sensing unit.
Figure 3:
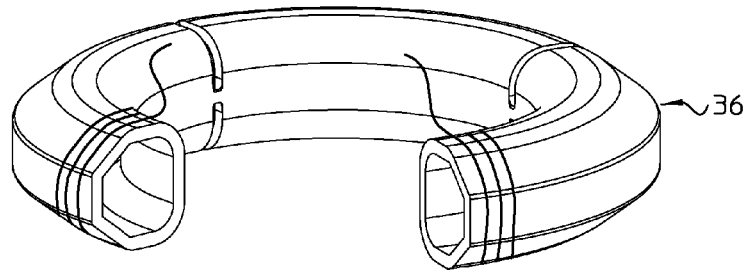
Figure 4A:
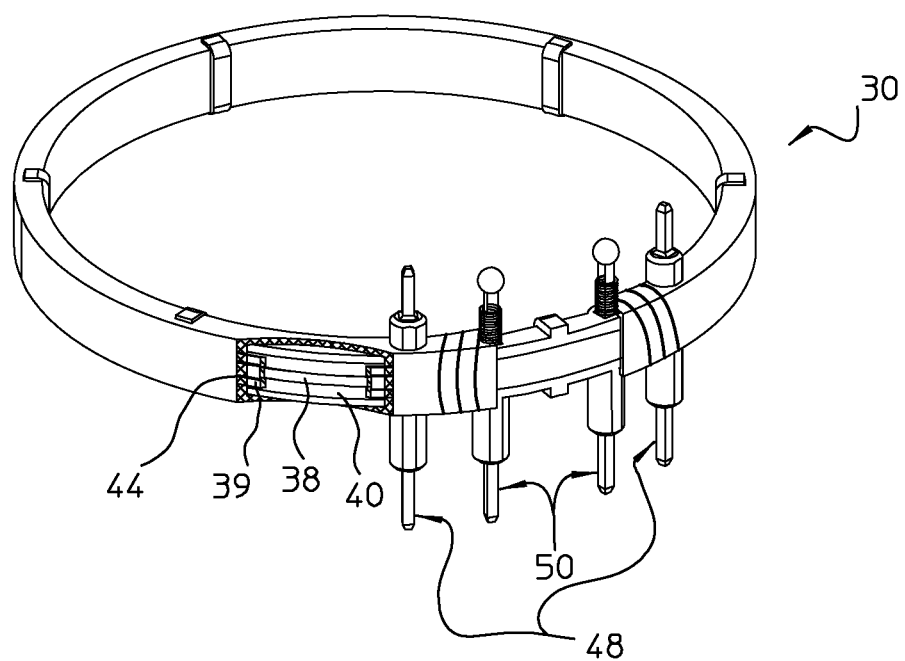
FIG. 4a is a perspective view with a partial cross section of a saturable core and excitation coil unit according to an embodiment of this invention.
Figure 4B:
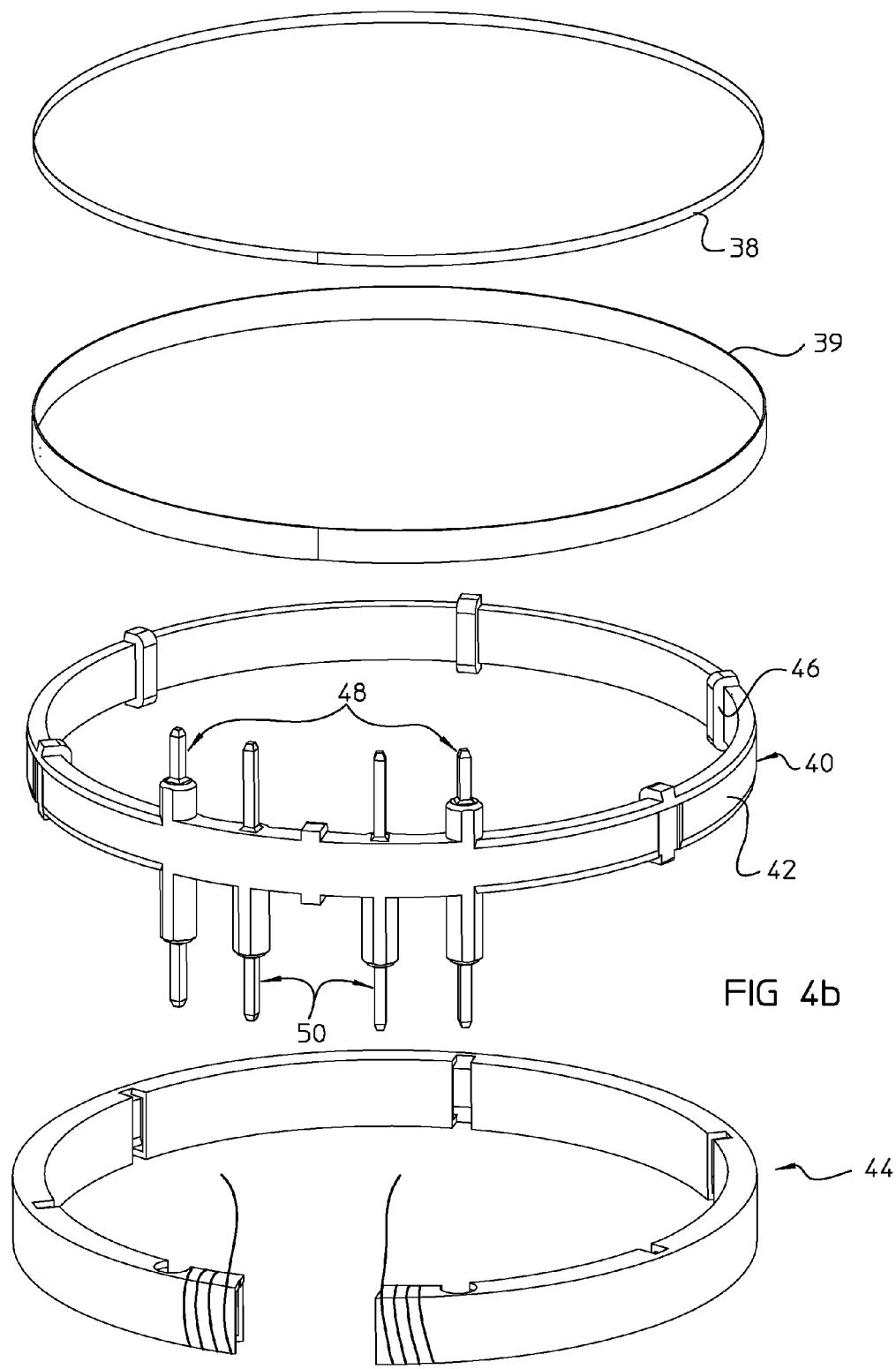

Referring now to FIG. 3 the toroidal fluxgate sensing unit 6 will be described in more detail. The sensing unit 6 comprises a saturable core unit 30 surrounding by a shield 32 formed of two parts 32a, 32b, further surrounded by a dielectric shell 34 having two parts 34a, 34b further surrounded by a secondary coil 36, also known as a compensation coil. As is well known in closed-loop transducers, the secondary or compensation coil 36 is driven by an electronic circuit connected to the saturable core unit 30 in a feed-back loop, whereby the secondary coil is driven to generate a magnetic field seeking to cancel the effect of the magnetic field generated by the primary conductor on the saturable core unit. The amplitude and direction of the secondary current forms a representation of the primary current and can thus be used as a measure of the primary current, which may be a differential current as mentioned above.

The secondary coil 36 is made of a thin conducting wire with an insulating coating that is wound around the dielectric shell 34. The representation in FIG. 3 is thus simplified in that the wire of the coil is not depicted but it is understood that the element 36 is formed of coil windings around the dielectric shell 34.

The saturable core unit 30 comprises a saturable core 38 that may advantageously be in a form of a strip or band of amorphous magnetic material such as Metglas 2714A that is mounted on a dielectric support 40 that is ring shaped and made for example of injected plastic material. The support 40 is preferably made of a single part as illustrated, but may also be made of two or more parts fixed together during assembly of the transducer. The strip of amorphous magnetic material 38 may be mounted with an adhesive coated on one side of the strip, or coated on the dielectric support 40 or preferably provided on an insulating tape 39 such that the amorphous strip 38 may be bonded to an outer surface 42 of the dielectric support. The strip of amorphous magnetic material may form a single layer on the support, optionally with a certain overlap at the opposed free ends, or form two or more layers on the support, as a single strip wound around the support or as a plurality of separate stacked strips.

An excitation coil 44 is wound around the dielectric support 40 and amorphous strip 38 positioned thereon. The insulating tape 39 may advantageously act as a protective dielectric separation between the windings of the excitation coil to prevent any electrical contact between the amorphous saturable core and the windings of the excitation coil, taking into account any vibration and movement that may cause friction between the coil windings and the amorphous strip. The ring shaped dielectric support 40 may advantageously comprise a plurality of spaced apart radial fins 46, for example three to seven radial fins distributed around the ring and projecting radially inwardly, the radial fins serving not only to provide lateral positioning support for the excitation coil but also serving to radially centre the support within and in respect to the shield elements 32a, 32b positioned therearound. The radial fins also act as spacers to avoid direct contact between the excitation coil and the shield elements 32a, 32b.

In a variant, the saturable core unit may be produced as a linear unit, whereby a linear strip or band of amorphous magnetic material is mounted on a linear insulating support and the excitation coil wound therearound, the linear unit then being bent into the final ring shape.

The excitation coil may be made of a thin copper wire or other conducting material. In view of the small thickness of the wire, the windings are not depicted in the figures, the excitation coil being represented by the reference number 44 illustrating the volume occupied by the excitation coil. A plurality of connection terminals 48, 50 are mounted to the dielectric support 40. The terminals may be lodged in a force fit manner in pre-formed cavities in the dielectric support, or locked by inter-engaging clips or fixed by over-moulding of the dielectric support on portions of the terminals 48, 50. In an embodiment where the support 40 is made of more than one part assembled together, the terminals may be preassembled to one of the support parts prior to assembly of the support parts together to form the complete support.

Advantageously, according to an aspect of the invention, there are at least two pairs of terminals, a first pair 50 connected to ends of the excitation coil 44 and a second pair 48 connected to ends of the secondary coil 36. The ends of the excitation coil and the ends of the secondary coil can be connected to the respective terminals 48, 50 by various known connection techniques such as welding, soldering, crimping, wrap-around post connection techniques or any other known connection technique between wires and connection terminals. The terminal connection portions may be in the form of pins or insulation displacement blades or crimp connections.

Integration of the connection terminals for both the excitation coil and the secondary coil in the support ring for the saturable core reduces the number of components and cost of manufacturing and assembly. Moreover this configuration provides a particularly compact arrangement.

The annular magnetic shielding shells 32a, 32b that surround the dielectric support 40 and saturable core strip 38 are provided with orifices 52 to allow the connection terminals 50, 48 to project therethrough for connection to the circuit board 8 on one side and for connection to the secondary coil on the opposite side. The connection portions 48*a* of the terminal pair 48 are sufficiently long to extend through the shielding shell and through orifices 54 provided in the dielectric shells 54*a* to allow the wire of the secondary coil to be connected and wound around the housing after assembly of the housing and shielding shell around the saturable core unit. The terminals 48, 50 and corresponding passages in the shielding shells 32*a*, 32*b* and insulating shells 34*a*, 34*b* may be arranged in a non-symmetrical manner in order to ensure correct orientation and assembly of the shielding shells and insulating shells to the saturable core unit 30. For example, the terminals 48 of the excitation conductor may be spaced at an irregular distance from the terminals 50 of the secondary coil.

The shielding shells 32*a*, 32*b* are made of a magnetic material with a high magnetic permeability and may advantageously be formed from a sheet of magnetic material, the two shielding shells 32*a*, 32*b* having an identical shape. When assembled together around the saturable core unit 30, the shielding shells 32*a*, 32*b* contact each other along their outer radial rim 56, whereas at their inner radial rim 58 a small air gap is provided. This configuration ensures accurate positioning of the shielding shells with respect to each other and around the saturable core unit as well as avoiding a short-circuit loop around the detector due to the inner radial air gap.

The insulating shells 34*a*, 34*b* advantageously comprise radial fins 59 spaced apart and distributed around the ring shaped insulating shells. The radial fins serve to laterally support the secondary coil wound around the insulating shell as well as providing positioning edges or surfaces that position the fluxgate sensing unit 6 within the transducer housing 4. The insulating shells may further be provided with positioning or fixing protrusions 60 that are received in complementary holes 61 provided in the circuit board 8 to position and solidly hold the circuit board to the sensing unit. The two housing shells 34*a*, 34*b* may comprise engaging clips that allow the housing shell parts to be fixed together during assembly. Alternatively, or in addition, other fixing or bonding means, such as ultrasound welding may be employed to fix the two insulating shells 34*a*, 34*b* together around the secondary coil and saturable core unit.

The invention claimed is:

1. Toroidal fluxgate current transducer comprising a ring shaped fluxgate sensing unit comprising a secondary coil made of a conducting wire, a ring-shaped dielectric support, a saturable magnetic core mounted on the support, an excitation coil made of a conducting wire wound around the support and saturable core, and a magnetic shell mounted around the excitation coil, ring-shaped support and saturable core, the support comprising terminals fixed to the support, a first pair of said terminals connected to ends of the excitation coil, and a second pair of said terminals connected to ends of the secondary coil of the current transducer, wherein the sensing unit further comprises dielectric housing shells mounted around the excitation coil and saturable core and forming a support around which the secondary coil is wound, the dielectric housing shell comprising a plurality of spaced apart radial fins.

2. Transducer according to claim 1, further comprising a circuit board connected to said terminals of the sensing unit.

3. Transducer according to claim 1, wherein the dielectric shell comprises protuberances engaging in complementary orifices in a circuit board of the transducer.

4. Transducer according to claim 1, wherein the ring-shaped dielectric support of the sensing unit comprises a plurality of spaced apart radial fins providing positioning surfaces configured to position the support with respect to magnetic shells mounted around the dielectric support and excitation conductor.

5. Transducer according to claim 1, further comprising a primary conductor unit provided as a separate component, comprising a dielectric body and one or more conductors configured for carrying a current to be measured held together within the dielectric body forming a general U or V-shaped component separably mountable through the central passage of the housing and lockable to the housing by complementary locking members provided on the dielectric body and housing.

6. Transducer according to claim 1, further comprising an inner magnetic shield and/or an outer magnetic shield.

7. Transducer according to claim 6, wherein the magnetic shields are made of a strip or band of material with a high magnetic permeability folded in a ring shape.

8. Toroidal fluxgate current transducer comprising a ring shaped fluxgate sensing unit comprising a secondary coil made of a conducting wire, a ring-shaped dielectric support, a saturable magnetic core mounted on the support, an excitation coil made of a conducting wire wound around the support and saturable core, and a magnetic shell mounted around the excitation coil, ring-shaped support and saturable core, the support comprising terminals fixed to the support, a first pair of said terminals connected to ends of the excitation coil, and a second pair of said terminals connected to ends of the secondary coil of the current transducer, wherein the sensing unit further comprises dielectric housing shells mounted around the excitation coil and saturable core and forming a support around which the secondary coil is wound, the dielectric shell comprising protuberances engaging in complementary orifices in a circuit board of the transducer.

9. Transducer according to claim 8, wherein the circuit board is connected to said terminals of the sensing unit.

10. Transducer according to claim 8, wherein the ring-shaped dielectric support of the sensing unit comprises a plurality of spaced apart radial fins providing positioning surfaces configured to position the support with respect to magnetic shells mounted around the dielectric support and excitation conductor.

11. Transducer according to claim 8, further comprising a primary conductor unit provided as a separate component, comprising a dielectric body and one or more conductors configured for carrying a current to be measured held together within the dielectric body forming a general U or V-shaped component separably mountable through the central passage of the housing and lockable to the housing by complementary locking members provided on the dielectric body and housing.

12. Transducer according to claim 8, further comprising an inner magnetic shield and/or an outer magnetic shield.

13. Transducer according to claim 12, wherein the magnetic shields are made of a strip or band of material with a high magnetic permeability folded in a ring shape.

14. Toroidal fluxgate current transducer comprising a ring shaped fluxgate sensing unit comprising a secondary coil made of a conducting wire, a ring-shaped dielectric support, a saturable magnetic core mounted on the support, an excitation coil made of a conducting wire wound around the support and saturable core, and a magnetic shell mounted around the excitation coil, ring-shaped support and saturable core, wherein the support comprises comprising terminals fixed to the support, a first pair of said terminals connected to ends of the excitation coil, and a second pair of said terminals connected to ends of the secondary coil of the current transducer, wherein the ring-shaped dielectric support of the sensing unit comprises a plurality of spaced apart radial fins providing positioning surfaces configured to position the support with respect to magnetic shells mounted around the dielectric support and excitation conductor.

15. Transducer according to claim 14, further comprising a circuit board connected to said terminals of the sensing unit.

16. Transducer according to claim 14, further comprising a primary conductor unit provided as a separate component, comprising a dielectric body and one or more conductors configured for carrying a current to be measured held together within the dielectric body forming a general U or V-shaped component separably mountable through the central passage of the housing and lockable to the housing by complementary locking members provided on the dielectric body and housing.

17. Transducer according to claim 14, further comprising an inner magnetic shield and/or an outer magnetic shield.

18. Transducer according to claim 17, wherein the magnetic shields are made of a strip or band of material with a high magnetic permeability folded in a ring shape.

19. Toroidal fluxgate current transducer comprising a ring shaped fluxgate sensing unit comprising a secondary coil made of a conducting wire, a ring-shaped dielectric support, a saturable magnetic core mounted on the support, an excitation coil made of a conducting wire wound around the support and saturable core, and a magnetic shell mounted around the excitation coil, ring-shaped support and saturable core, wherein the support comprises comprising terminals fixed to the support, a first pair of said terminals connected to ends of the excitation coil, and a second pair of said terminals connected to ends of the secondary coil of the current transducer, further comprising a primary conductor unit provided as a separate component, comprising a dielectric body and one or more conductors configured for carrying a current to be measured held together within the dielectric body forming a general U or V-shaped component separably mountable through the central passage of the housing and lockable to the housing by complementary locking members provided on the dielectric body and housing.

20. Transducer according to claim 19, further comprising a circuit board connected to said terminals of the sensing unit.

21. Transducer according to claim 19, further comprising an inner magnetic shield and/or an outer magnetic shield.

22. Transducer according to claim 21, wherein the magnetic shields are made of a strip or band of material with a high magnetic permeability folded in a ring shape.

* * * * *